United States Patent
Sargeant

(10) Patent No.: US 6,316,977 B1
(45) Date of Patent: Nov. 13, 2001

(54) LOW CHARGE-INJECTION CHARGE PUMP

(75) Inventor: Winslow Sargeant, Allentown, PA (US)

(73) Assignee: PMC-Sierra, Inc., British Columbia (CA)

( * ) Notice: Subject to any disclaimer, the term of this patent is extended or adjusted under 35 U.S.C. 154(b) by 0 days.

(21) Appl. No.: 09/617,201

(22) Filed: Jul. 14, 2000

(51) Int. Cl.[7] ............................................. H03L 7/06
(52) U.S. Cl. ............................................................ 327/157
(58) Field of Search ................................. 327/150, 148, 327/157, 159, 536, 537; 331/17; 375/374

(56) References Cited

U.S. PATENT DOCUMENTS

| | | | |
|---|---|---|---|
| 4,523,150 | 6/1985 | Hogeboom | 328/133 |
| 4,750,193 | 6/1988 | Bailey | 375/81 |
| 4,803,705 | 2/1989 | Gillingham et al. | 375/120 |
| 5,532,636 * | 7/1996 | Mar et al. | 327/543 |
| 5,576,647 | 11/1996 | Sutardja et al. | 327/108 |
| 5,623,523 | 4/1997 | Gehrke | 375/376 |
| 5,646,563 | 7/1997 | Kuo | 327/157 |
| 5,699,387 | 12/1997 | Seto et al. | 375/376 |
| 5,703,511 * | 12/1997 | Okamoto | 327/148 |
| 5,734,301 | 3/1998 | Lee et al. | 331/2 |
| 5,742,191 | 4/1998 | Romesburg et al. | 327/156 |
| 5,783,972 | 7/1998 | Nishikawa | 331/17 |
| 5,818,287 * | 10/1998 | Chow | 327/536 |
| 5,870,003 | 2/1999 | Boerstler | 331/17 |
| 5,886,551 | 3/1999 | Narahara | 327/157 |
| 5,945,855 | 8/1999 | Momtaz | 327/157 |
| 5,949,264 | 9/1999 | Lo | 327/157 |
| 5,952,892 | 9/1999 | Szajda | 331/57 |
| 5,963,099 | 10/1999 | Nagoya et al. | 331/17 |
| 5,986,487 | 11/1999 | Ridgers | 327/157 |
| 6,107,849 * | 8/2000 | Williams et al. | 327/157 |
| 6,124,741 * | 9/2000 | Arcus | 327/112 |
| 6,160,432 * | 12/2000 | Rhee et al. | 327/157 |

* cited by examiner

*Primary Examiner*—My-Trang Nu Ton
(74) *Attorney, Agent, or Firm*—Morgan, Lewis & Bockius LLP

(57) ABSTRACT

There is provided a low charge-injection charge pump for supplying charge into a charge summing node to generate a low noise output voltage. The charge pump includes a PMOS current source coupled between a first PMOS switch and a charge summing node. The charge pump also has a NMOS current source coupled between a first NMOS switch and the charge summing node. The switches operate to turn ON the current sources to allow charge to flow into, or out of, the charge summing node to increase or decrease the voltage present on the charge summing node. The positioning of the switches away from the charge summing node serves to prevent channel charges in the first PMOS switch and in the first NMOS switch from flowing into the charge summing node when either of the two switches are turned OFF. Furthermore, a second PMOS switch and a second NMOS switch are employed to dissipate channel charges flowing from the channels of the first PMOS and NMOS switches when those switches are turned OFF. The second PMOS and NMOS switches also operate to bias the PMOS and NMOS current sources so that they do not conduct when the first PMOS and NMOS switches are turned OFF. The dissipation of channel charge and the biasing of the current sources operate to reduce noise on the charge summing node.

16 Claims, 8 Drawing Sheets

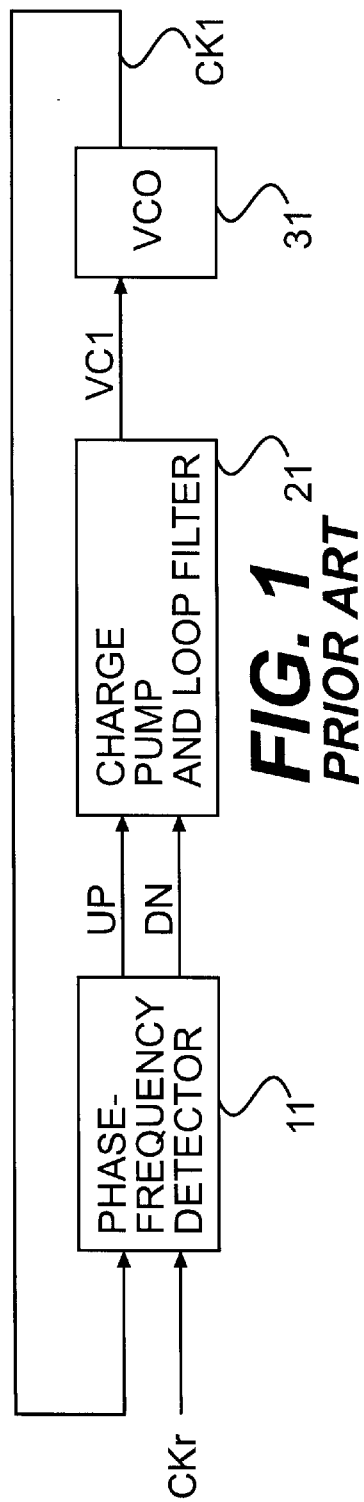
FIG. 1 *PRIOR ART*
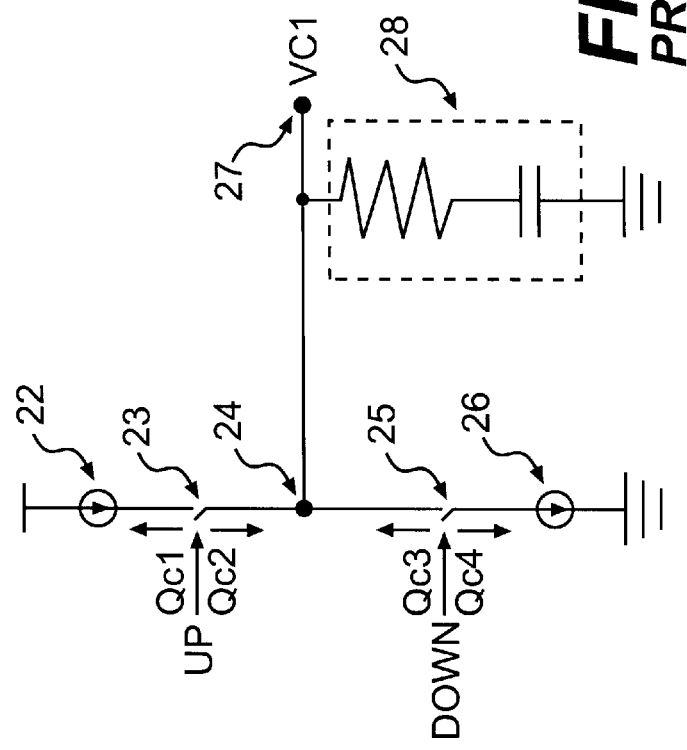
FIG. 2 *PRIOR ART*

LOW CHARGE-INJECTION CHARGE PUMP

BACKGROUND OF THE INVENTION

1. Field of the Invention

The present invention relates to a charge pump. More particularly, the present invention relates to a low charge-injection charge pump for use in low noise, low power, and high speed networking or telecommunications systems.

2. Discussion of the Related Art

Charge pumps are an important element of many electronic circuits such as phase locked loop (PLL) circuits. For example, FIG. 1 illustrates a typical PLL circuit having a phase-frequency detector 11 and a conventional charge pump and loop filter 21 driving a voltage controlled oscillator (VCO) 31. When the phase-frequency detector 11 detects that the phase and frequency of a reference clock CKr is greater than the phase and frequency of the feedback clock CK1, an UP signal is generated. The UP signal causes the charge pump and loop filter 21 to incrementally increase the output voltage VC1 thereby increasing the frequency of feedback clock CK1. When the phase-frequency detector 11 detects that the phase and frequency of the feedback clock CK1 is greater than the phase and frequency of the reference clock CKr, a DN signal is generated. The DN signal causes the charge pump and loop filter 21 to incrementally decrease its output voltage VC1 thereby decreasing the frequency of feedback clock CK1. When the reference clock CKr and the feedback clock CK1 are synchronized, neither the DN signal nor the UP signal is received by the charge pump and loop filter 21 and the voltage VC1 remains constant.

The structure and operation of a conventional charge pump will now be described. Typically, a charge pump generates an output voltage on a charge summing node by dumping charge onto the node from a current source via a switch, or by sinking charge from the charge summing node to a current sink via a switch. An output voltage VC1 is generated by the accumulated charge present on the charge summing node.

FIG. 2 shows a conventional charge pump circuit employed by the prior art PLL of FIG. 1. The conventional charge pump circuit includes a current source 22, a current sink 26, an UP switch 23, a DN switch 25, and an RC loop filter 28. The current source 22 is connected between VDD and the UP switch 23 while the current sink 26 is connected between the DN switch 25 and ground. When the UP signal is asserted, the UP switch 23 closes allowing current to flow into the charge summing node, thereby causing the voltage VC1 to increase. When the DN signal is asserted, the DN switch closes allowing current to flow out of the charge summing node 24, thereby causing the voltage VC1 to decrease. An RC loop filter 28 is connected to the output of the charge pump to reduce the speed at which VC1 varies.

During the time when the UP switch 23 (e.g., a PMOS switch) is turned ON (closed), a channel charge exists in a channel located between the source and drain of the switch 23. When the switch is turned OFF (opened), the channel collapses causing a portion Qc1 of the channel charge to flow into the current source 22 and causing a portion Qc2 of the channel charge to flow into the charge summing node 24. Likewise, during the time when the DN switch 25 (e.g., an NMOS switch) is turned ON, a channel charge exists in the channel between the source and drain of DN switch 25. When switch 25 is turned off, the channel collapses causing a portion Qc4 of the channel charge to flow into the current source 26 and causing a portion Qc3 of the channel charge to flow into the charge summing node 24. These charges flowing into the charge summing node 24 introduce undesirable transients on the line between the charge summing node and VC1 thereby causing the voltage VC1 to fluctuate. In a case where the output VC1 of the charge pump drives the control input of a VCO in a PLL, these fluctuations can introduce undesirable jitter in the output clock of the PLL.

A need therefore exists for an improved charge pump that solves the problems described herein by reducing the effect of the voltage fluctuations caused by charge injected electrons and holes disturbing the charge summing node when charge pump switches are turned off.

SUMMARY OF THE INVENTION

Accordingly, the present invention is directed to a charge pump capable of reducing fluctuations in the output voltage. In particular, the present invention provides an apparatus and method of preventing channel charges, present in the drain/source channel of FET switches, from disturbing the voltage on a charge summing node of a charge pump.

To achieve these and other advantages and in accordance with the purpose of the present invention, as embodied and broadly described, there is provided a low charge-injection charge pump, comprising a first FET current source, coupled to a charge summing node, for supplying charge to the charge summing node, a first FET switch, switchably coupling the first FET current source to a positive voltage supply, the first FET switch being controlled to supply current to the first FET current source in response to assertion of a first input signal, a second FET current source, coupled to a charge summing node, for removing the charge from the charge summing node, a second FET switch, switchably coupling the second FET current source to a negative voltage supply, the second FET switch being controlled to sink current from the second FET current source in response to assertion of a second input signal, wherein an output voltage of the charge summing node increases in response to the assertion of the first input signal and decreases in response to the assertion of the second input signal, a first biasing circuit that in response to deassertion of the first input signal biases the first FET current source so that the first FET current source does not conduct current, and a second biasing circuit that in response to deassertion of the second input signal biases the second FET current source so that the second FET current source does not conduct current.

In another aspect of the instant invention, there is provided a low charge-injection charge pump, wherein the first biasing circuit includes a third FET switch, switchably coupling a first bias voltage to the first FET current source in response to deassertion of the first input signal and decoupling the first bias voltage from the first FET current source in response to the assertion of the first input signal, and wherein the second biasing circuit includes a fourth FET switch, switchably coupling a second bias voltage to the second FET current source in response to deassertion of the second input signal and decoupling the second bias voltage from the second FET current source in response to the assertion of the second input signal.

In another aspect of the instant invention, there is provided a method for supplying charge to a charge summing node to generate a low noise output voltage by a circuit, the circuit comprising a first FET current source coupled to the charge summing node and a first FET switch for supplying current to the first FET current source, the method comprising the steps of controlling the first FET switch to turn ON so that current is supplied to the first FET current source thereby causing the first FET current source to supply charge to the charge summing node and biasing the first FET current source to cause the first FET current source to turn ON when the first FET switch is turned ON, then controlling the first FET switch to turn OFF so that current is not supplied to the first FET current source thereby preventing the first FET current source from supplying charge to the charge summing node and biasing the first FET current source to cause the first FET current source to turn OFF when the first FET switch is turned OFF.

In another aspect of the instant invention, there is provided a method for supplying charge to a charge summing node, further comprising the steps of coupling a first low impedance path to the first FET switch when the first FET switch is turned OFF so that channel charge present in the channel of the first FET switch is removed, and decoupling the first low impedance path from the first FET switch when the first FET switch is turned ON, thereby preventing channel charge present in the first FET switch from causing noise in the output voltage of the charge summing node.

Additional features and advantages of the present invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention that together with the description serve to explain the principles of the invention.

In the drawings:

FIG. 1 illustrates an example of a conventional charge pump driving the VCO of a PLL;

FIG. 2 illustrates a detailed description of the conventional charge pump circuit of FIG. 1;

DETAILED DESCRIPTION OF THE PREFERRED EMBODIMENTS

Reference will now be made in detail to the preferred embodiments of the present invention, examples of which are illustrated in the accompanying drawings.

Figure 3:
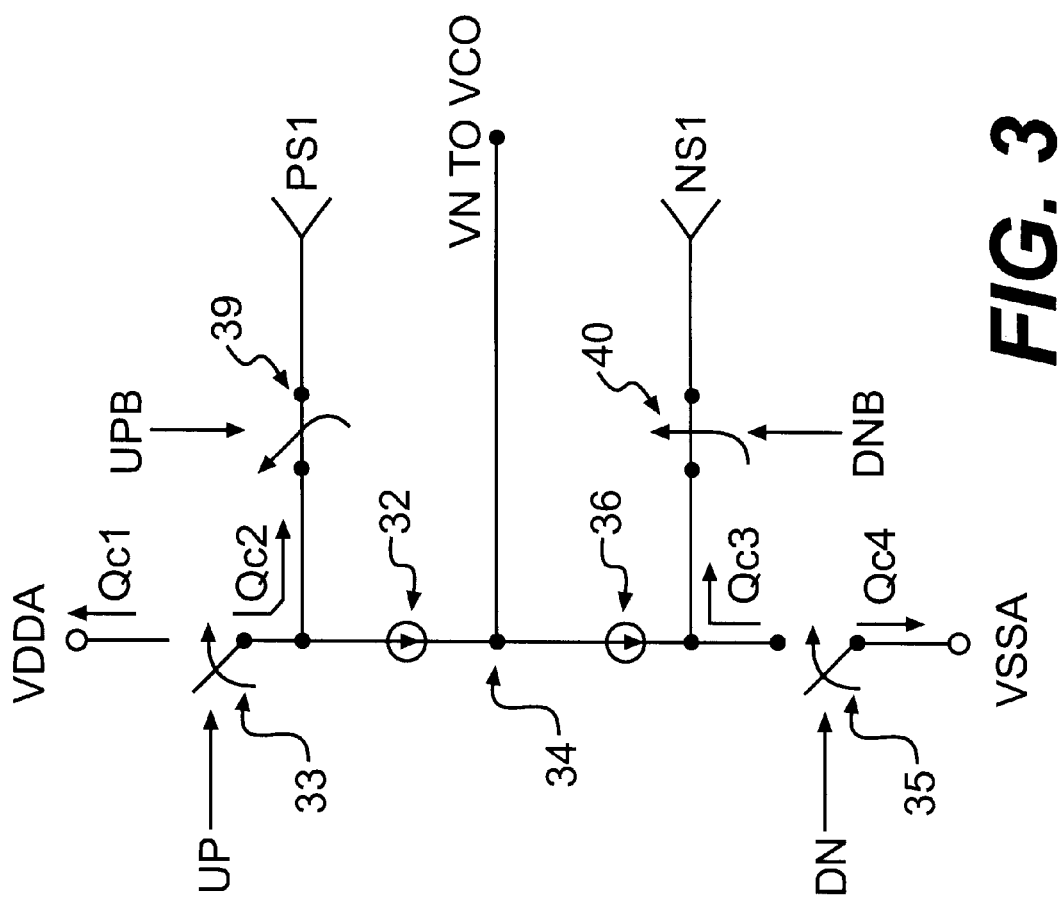
FIG. 3 illustrates the placement of current sources and switches of a low charge-injection charge pump circuit of the present invention.

FIG. 3 shows an embodiment of the present invention that could be used in the PLL circuit of FIG. 1. As shown, a pair of current sources 32 and 36 are coupled to a charge summing node 34 where a voltage VN is generated due to the accumulated charges. Current source 32 is switchably coupled to VDDA via switch 33, and current source 36 is switchably coupled to VSSA via switch 35. In addition, a node between current source 32 and switch 33 is switchably coupled to a bias voltage PS1, and a node between the current source 36 and switch 35 is switchably coupled to bias voltage NS1.

The operation of the circuit of FIG. 3 will now be described. As applied to the operation of the circuits herein, the term "ON" will refer to a closed or conducting switch while the term "OFF" will refer to an open or non-conducting switch. When switch 33 is turned OFF, switch 39 is turned ON, and a portion Qc1 of the channel charge flows out of the collapsing channel of switch 33 into VDDA and a portion Qc2 of the channel charge flows into the low impedance path provided by switch 39.

Likewise, when switch 35 is turned OFF, switch 40 is turned ON, and a portion Qc4 of the channel charge flows out of the collapsing channel of switch 35 into VSSA and a portion Qc3 flows into the low impedance path provided by switch 40. Therefore, because of the low impedance paths provided by switches 39 and 40, and because of the placement of the switches 33 and 35 away from the charge summing node 34, the channel charges (Qc1–Qc4), flowing from the collapsing switch channels, are prevented from affecting the aggregate charge on the charge summing node 34.

Figure 4A:
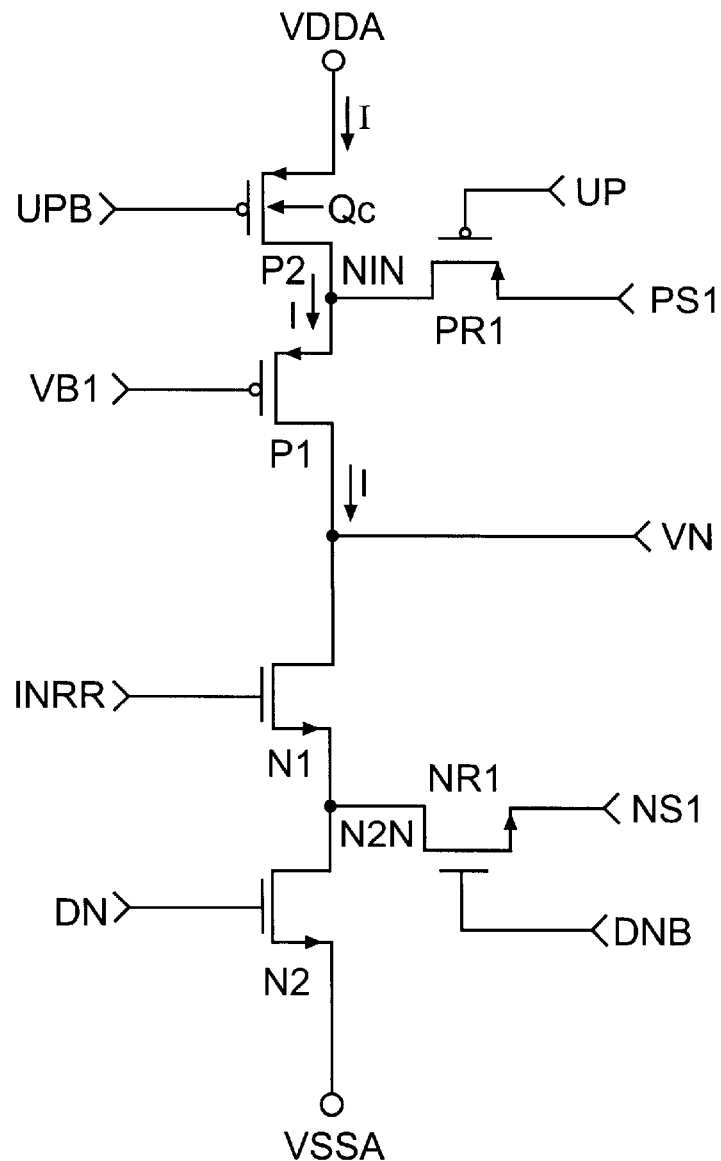
FIG. 4a illustrates a detailed example of the flow of current in a CMOS implementation of a low charge-injection charge pump circuit of the present invention when the UP signal is asserted.

FIG. 4a illustrates an example of an embodiment of a low charge-injection charge pump of the present invention implemented with PMOS and NMOS devices. This charge pump circuit incorporates, for example, PMOS switches P2 and PR1, a PMOS current source P1, NMOS switches N2 and NR1, and an NMOS current source N1. The source of P2 is coupled to VDDA. The drain of P2 is coupled to the source of P1 and to the source of PR1 thereby forming voltage node N1N. The gate of P2 is driven by input signal UPB (negated UP) while the gate of PR1 is driven by input signal UP. The gate of P1 is coupled to voltage bias VB1 while the drain of PR1 is coupled to voltage bias PS1.

The drain of N1 is coupled to the drain of P1 and forms a charge summing node where output voltage VN is obtained. The source of N1 is coupled to the drain of N2 and to the drain of NR1 thereby forming voltage node N2N. The gate of N1 is coupled to bias voltage INRR while the gate of NR1 is driven by DNB (negated DN). The source of N2 is coupled to ground while the gate of N2 is driven by signal DN.

VDDA is typically set to 3 volts or lower based on the technology. In some cases, the value of VDDA can be set to below 1.6 volts. VSSA is typically set to 0 volts. Voltage bias VB1 is typically set to an approximate value of 1.53 volts to allow P1 to source current to charge summing node VN. Voltage bias INRR is typically set to a value of about 0.82 volts to allow N1 to sink current from charge summing node VN. A first set of matching bias voltage generating circuits (not shown) provide bias voltages PS1 and VB1, which have an approximately equal voltage. A second set of bias voltage generating circuits (not shown) provide bias voltage NS1 and INRR, which also have an approximately equal voltage.

Bias voltage VB1 is based on the threshold voltage Vt of P1 and the amount of current that flows through P1. Bias voltage INRR is based on the threshold voltage Vt of N1 and the amount of current flowing through N1. As the technology scales, the INRR and VB1 bias voltages will also scale. However, with regard to INRR and VB1, the scaling factor is not necessarily proportional to the threshold voltage Vt of the CMOS transistors.

Next, the operation of the invention of the present embodiment will be described with reference to the circuits shown in FIGS. 4a, 4b, 5a, and 5b, and with reference to the timing diagram shown in FIG. 6. As used herein, the term "asserted" means a control state which causes either of switches P2 or N2 to conduct. Accordingly, an asserted signal is a low voltage signal if it controls switch P2 (a PMOS device) or a high voltage signal if it controls switch N2 (an NMOS device). In FIG. 6, the input control signals UP and UPB are shown as a series of pulses ranging from approximately 0 volts to 3 volts, or VDDA (could be less than 1.6 volts), wherein the peak of the signal UP and the valley of signal UPB represents the asserted state. As can be seen, the signal UPB is the negated value of signal UP. Also, input control signals DN and DNB are shown ranging from approximately 0 volts to 3 volts, or VDDA (could be less than 1.6 volts), wherein the peak of the signal DN and the valley of signal DNB represents the asserted state. As can be seen, the signal DNB is the negated value of signal DN. Also, the output signal VN is shown increasing as the charge accumulates in the charge summing node due to the action of the input control signals UP, UPB, DN, and DNB.

FIG. 4a shows the operation of the circuit when control signals UP and UPB are asserted. UPB is asserted low causing switch P2 to turn ON thereby allowing current to flow through P2 to P1. A channel charge Qc now exists in the channel of switch P2. Also, because P2 is turned ON, the voltage present at node N1N is approximately VDDA, which in combination with the biasing voltage VB1, present on the gate of P1, causes the current source P1 to turn ON. Therefore, current from the current source P1 flows into the charge summing node causing the voltage VN present on the charge summing node to increase. PR1 remains in an OFF state because the control signal UP is asserted high thereby creating a high impedance path between the drain of P2 and bias voltage PS1.

Figure 4B:
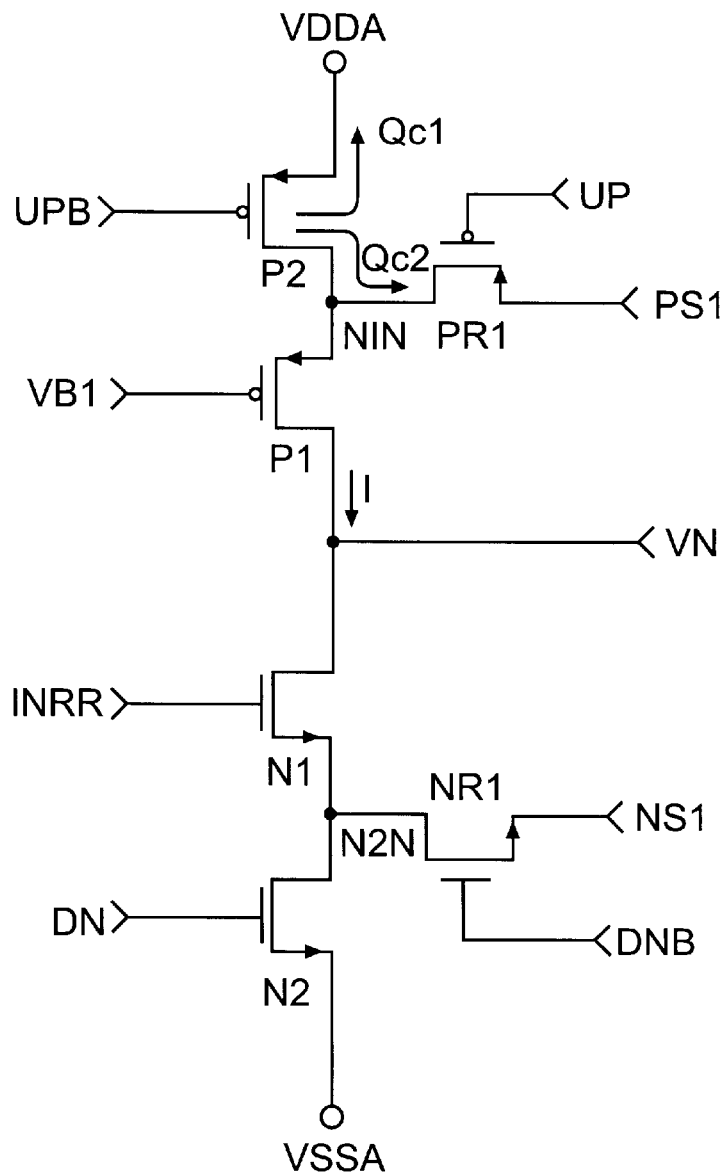
FIG. 4b illustrates a detailed example of the flow of channel charges of the CMOS implementation of the low charge-injection charge pump circuit of the present invention when the UP signal is deasserted.

FIG. 4b shows the operation of the circuit when UP and UPB are deasserted. UPB is deasserted high causing switch P2 to turn OFF thereby shutting off current to the current source P1. At the same time, UP is deasserted low causing switch PR1 to turn ON thereby providing a low impedance path between the drain of P2 and the biasing circuit that provides bias voltage PS1. When P2 is turned OFF, channel charge, present in the collapsing source/drain channel of P2, begins to flow out of the channel. A portion Qc1 of the channel charge Qc flows into the power supply VDDA and another portion Qc2 of the channel charge Qc flows into the low impedance path provided by PR1. Therefore, the channel charge is dissipated without disturbing the voltage VN present on the charge summing node.

Because P2 is turned OFF, the voltage present at node N1N would normally tend to "float." This tri-stated condition is undesirable because the source of P1 can approach a voltage significantly higher than the biasing voltage VB1. If this occurs, P1 can undesirably turn partially ON and erroneously introduce charge into the charge summing node thereby causing noise on the output voltage VN. Switch PR1 solves this problem by coupling the bias voltage PS1 to node N1N. Therefore, at the time when P2 is turned OFF, the source and gate of P1 are maintained at approximately the same voltage level, thereby ensuring that P1 remains turned OFF and does not supply charge to the charge summing node VN. Furthermore, because current source P2 does not experience the same drastic gate/source voltage swings as switch P2, the channel charge flowing from the source/drain channel of P1 are minimized.

Figure 5A:
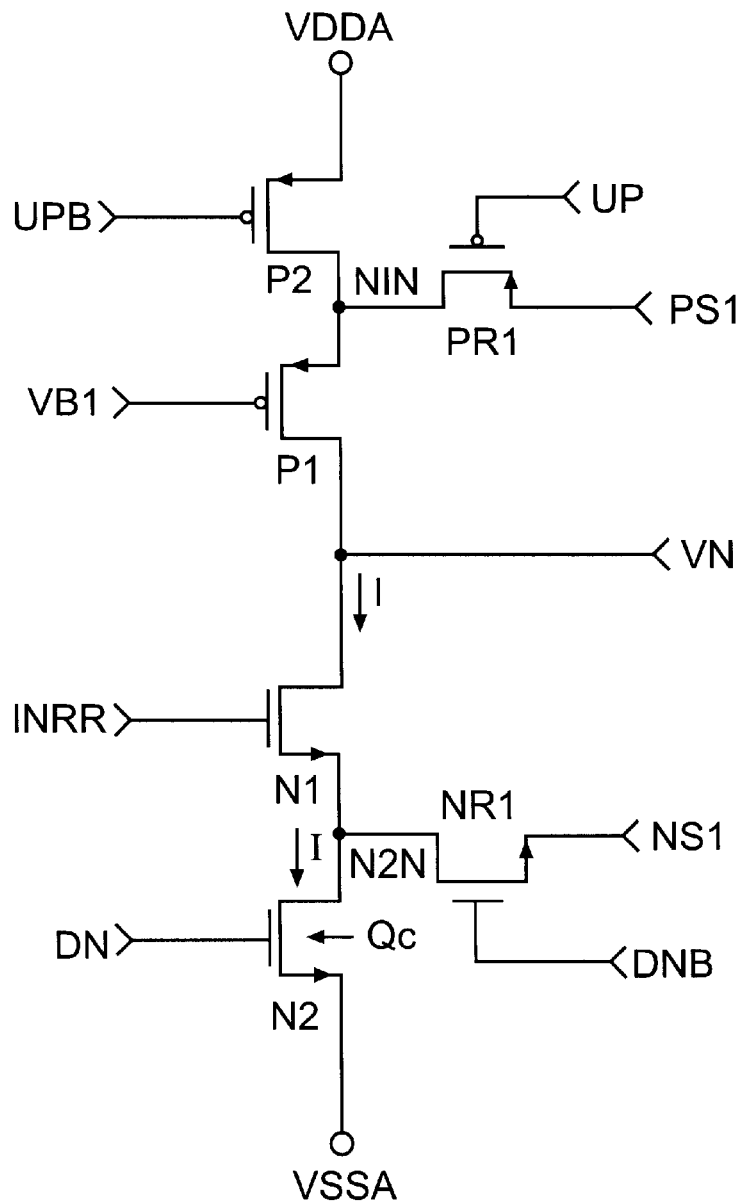
FIG. 5a illustrates a detailed example of the flow of current of the CMOS implementation of a low charge-injection charge pump circuit of the present invention when the DN signal is asserted.

FIG. 5a shows the operation of the circuit when DN and DNB are asserted. DN is asserted high causing switch N2 to turn ON thereby allowing current to flow through N2 from N1. A channel charge Qc now exists in the channel of switch N2. Also, because N2 is turned ON, the voltage present at node N2N is approximately VSSA, which in combination with the biasing voltage INRR, present on the gate of N1, causes the current source N1 to turn ON. Therefore, current from the charge summing node flows into current source N1 causing the voltage VN present on the charge summing node to decrease. The control signal DNB is asserted low causing NR1 to be turned OFF thereby creating a high impedance path between the node N2N and bias voltage NS1.

Figure 5B:
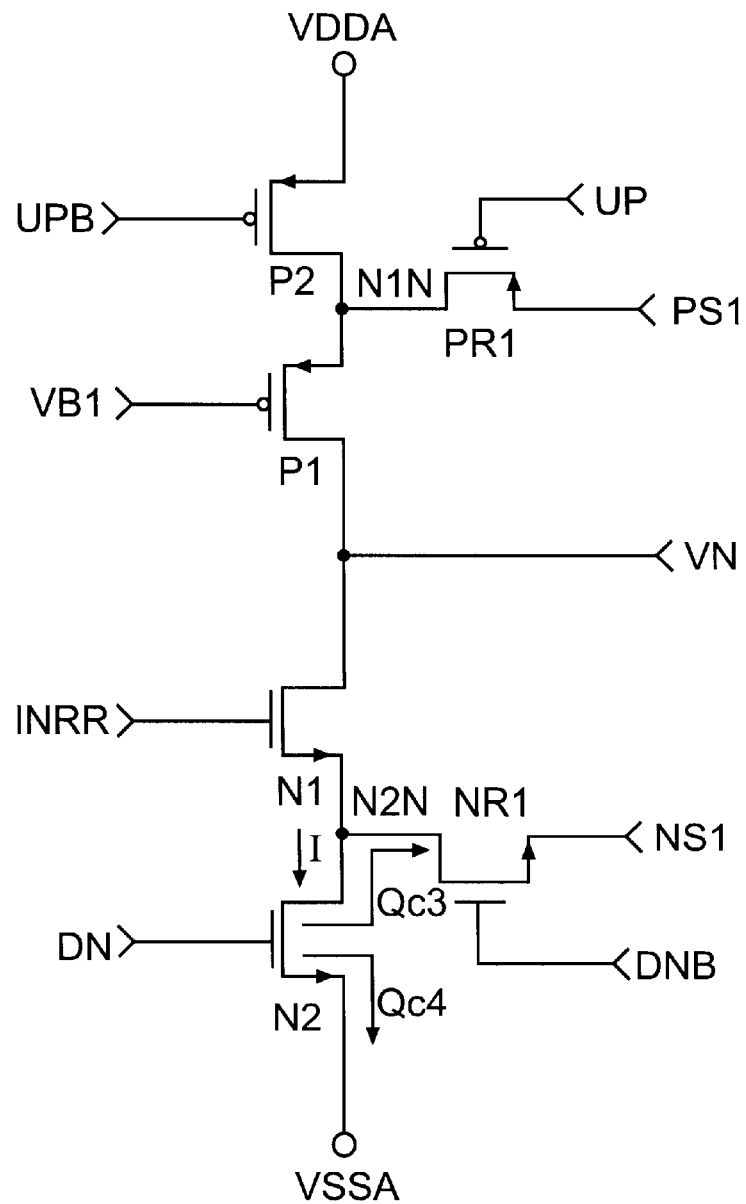
FIG. 5b illustrates a detailed example of the flow of channel charges of the CMOS implementation of a low charge-injection charge pump circuit of the present invention when the DN signal is deasserted.
Figure 6A:
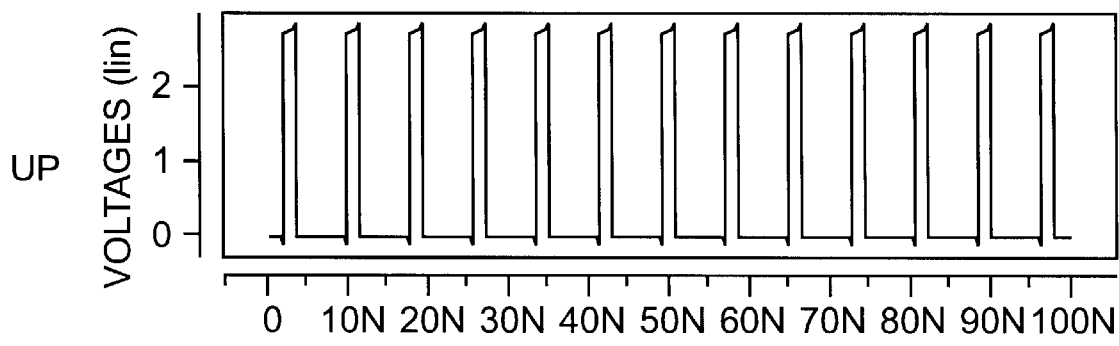
FIG. 6 is a timing diagram showing the timing and voltage of input control signals UP, UPB, DN, and DNB, and of output voltage VN.
Figure 6B:
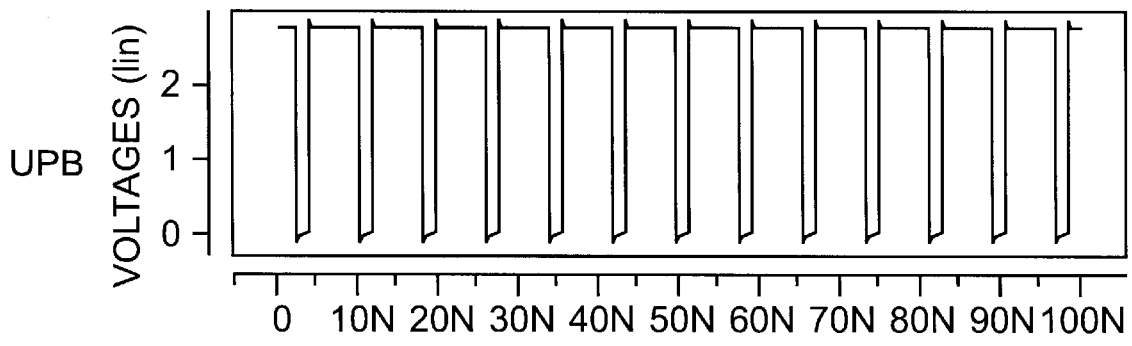
Figure 6C:
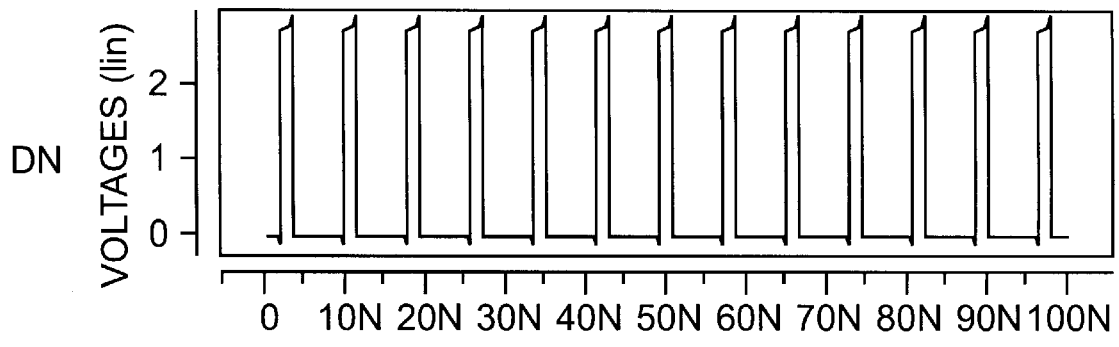
Figure 6D:
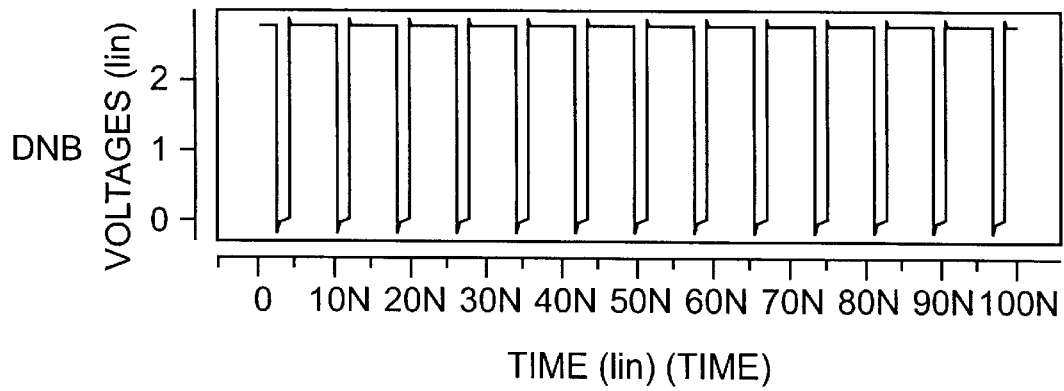
Figure 6E:
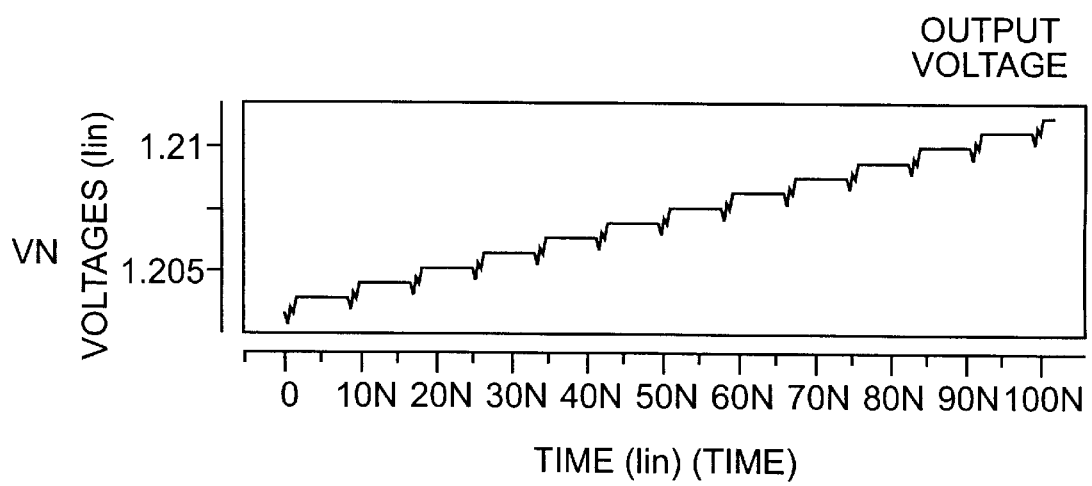

FIG. 5b shows the operation of the circuit when DN and DNB are deasserted. DN is deasserted low causing switch N2 to turn OFF thereby preventing current from flowing from N1 to VSSA. At the same time, DNB is deasserted high causing switch NR2 to turn ON thereby providing a low impedance path between N2N and the biasing circuit that provides bias voltage NS1. When N2 is turned OFF, channel charge Qc, present in the collapsing source/drain channel of N2, begins to flow out of the channel. A portion Qc4 of the channel charge Qc flows into the power supply VSSA and another portion Qc3 of the channel charge Qc flows into the low impedance path provided by NR1. Therefore, the channel charge Qc is dissipated without disturbing the voltage present on the charge summing node.

Because N2 is turned OFF, the voltage present at the node N2N would normally tend to "float." This tri-stated condition is undesirable because the node N2N can approach a voltage significantly lower than the biasing voltage INNR. If this occurs, N1 can undesirably turn partially ON and erroneously remove charge from the charge summing node thereby causing noise on the output voltage VN. Switch NR1 solves this problem by coupling the bias voltage NS1 to the node N2N. Therefore, at the time when N2 is turned OFF, the source and gate of N1 are maintained at approximately the same voltage level, thereby ensuring that N1 remains turned OFF and does not remove charge from the charge summing node.

Accordingly, switches PR1 and NR1 serve to dissipate channel charges flowing from the channels of switches P2 and N2 when switches P2 and N2 are turned OFF. Switches PR1 and NR1 also operate to bias current sources P1 and N1 so that they do not conduct when switches P2 and N2 are turned OFF. As a result, the dissipation of switch channel charges and the biasing of the current sources operate to reduce noise on the charge summing node.

The charge pump design is robust enough to operate using power supply voltages of well below 3 volts. As the technology scales (e.g., the threshold voltage Vt of the CMOS transistor changes), the operating voltage range also scales. This allows operation of the charge pump at very low supply voltages. For example, charge pump designs of the present invention using 0.18 $\mu$m technology, with supply voltages of 1.8 volts±10%, perform well and have very low jitter.

The charge pump circuit of the present invention scales easily to shorter gate-length technology. Because the circuit of the present invention is a singled-ended design, it is able to use a simple biasing mechanism for P1 and N1, rather than using the more complicated common-mode feedback mechanism found in conventional circuits. Accordingly, the linear range of the circuit can be 1 Vt above ground to 1 Vt below VDDA. For example, for a 1.8 volt technology with a 0.4 Vt for both N1 and P1, the operating range of the circuit is 0.4 volts to 1.4 volts (1.8v-0.4v).

While the preferred embodiment employs CMOS transistors to implement the current sources and switches, other semiconductor technologies can be employed to realize the significant benefits of the present invention. Further, the uses for the charge pump of the present invention vary widely and can include such applications as biomedical devices, audio amplifiers, and mixed signal circuits.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. A low charge-injection charge pump, comprising:
   a first FET current source, coupled to a charge summing node, for supplying charge to the charge summing node;
   a first FET switch, switchably coupling the first FET current source to a first reference voltage supply, the first FET switch being controlled to supply current to the first FET current source in response to assertion of a first input signal;
   a second FET current source, coupled to a charge summing node, for removing the charge from the charge summing node;
   a second FET switch, switchably coupling the second FET current source to a second reference voltage supply, the second FET switch being controlled to sink current from the second FET current source in response to assertion of a second input signal, wherein an output voltage of the charge summing node increases in response to the assertion of the first input signal and decreases in response to the assertion of the second input signal;
   a first biasing circuit that in response to deassertion of the first input signal biases the first FET current source so that the first FET current source does not conduct current; and
   a second biasing circuit that in response to deassertion of the second input signal biases the second FET current source so that the second FET current source does not conduct current.

2. The low charge-injection charge pump according to claim 1, wherein the first biasing circuit includes a third FET switch, switchably coupling a first bias voltage to the first FET current source in response to deassertion of the first input signal and decoupling the first bias voltage from the first FET current source in response to the assertion of the first input signal, and wherein the second biasing circuit includes a fourth FET switch, switchably coupling a second bias voltage to the second FET current source in response to deassertion of the second input signal and decoupling the second bias voltage from the second FET current source in response to the assertion of the second input signal.

3. The low charge-injection charge pump according to claim 2, wherein the first and third FET switches are PMOS switches, the second and fourth FET switches are NMOS switches, the first FET current source is a PMOS current source, and the second FET current source is an NMOS current source.

4. The low charge-injection charge pump according to claim 2, wherein
   a source of the first FET switch is coupled to the positive voltage supply;
   a drain of the first FET switch is coupled to a source of the first FET current source and to a source of the third FET switch;
   a drain of the first FET current source is coupled to a drain of the second FET current source and to the charge summing node;
   a source of the second FET current source is coupled to the drain of the second FET switch and to the drain of the fourth FET switch.
   a source of the second FET switch is coupled to a negative voltage supply;
   a gate of the first FET current source is biased by a third bias voltage and a gate of the second FET current source is biased by a fourth bias voltage;
   a drain of the third FET switch is coupled to the first bias voltage and a source of the fourth FET switch is coupled to the second bias voltage, wherein the first bias voltage is approximately equal to the third bias voltage, and the second bias voltage is approximately equal to the fourth bias voltage;
   a gate of the first FET switch is driven by the first input signal and a gate of the third FET switch is driven by a negated first input signal; and
   a gate of the second FET switch is driven by a negated second input signal and a gate of the fourth PET switch is driven by the second input signal.

5. The low charge-injection charge pump according to claim 1, wherein the first biasing circuit, in response to deassertion of the first input signal, provides a first low impedance path to remove channel charge from the first FET switch, and the second biasing circuit, in response to deassertion of the second input signal, provides a second low impedance path to remove channel charge from the second FET switch.

6. The low charge-injection charge pump according to claim 5, wherein the first biasing circuit includes a third FET switch, switchably coupling a first biasing voltage to the first FET current source and to the first FET switch in response to deassertion of the first input signal, and switchably decoupling the first bias voltage from the first FET current source and the first FET switch in response to the assertion of the first input signal, and wherein the second biasing circuit includes a fourth FET switch, switchably coupling a second bias voltage to the second FET current source and the second FET switch in response to deassertion of the second input signal and decoupling the second bias voltage from the second FET current source and the second FET switch in response to the assertion of the second input signal.

7. The low charge-injection charge pump according to claim 6, wherein the first and third FET switches are PMOS switches, the second and fourth FET switches are NMOS switches, the first FET current source is a PMOS current source, and the second FET current source is an NMOS current source.

8. The low charge-injection charge pump according to claim 6, wherein
   a source of the first FET switch is coupled to the positive voltage supply;
   a drain of the first FET switch is coupled to a source of the first FET current source and to a source of the third FET switch;
   a drain of the first FET current source is coupled to a drain of the second FET current source and to the charge summing node;
   a source of the second FET current source is coupled to the drain of the second FET switch and to the drain of the fourth FET switch;
   a source of the second FET switch is coupled to a negative voltage supply;
   a gate of the first FET current source is biased by a third bias voltage and a gate of the second FET current source is biased by a fourth bias voltage;
   a drain of the third FET switch is coupled to the first bias voltage and a source of the fourth FET switch is coupled to the second bias voltage, wherein the first bias voltage is approximately equal to the third bias voltage, and the second bias voltage is approximately equal to the fourth bias voltage;
   a gate of the first FET switch is driven by the first input signal and a gate of the third FET switch is driven by a negated first input signal; and
   a gate of the second FET switch is driven by a negated second input signal and a gate of the fourth FET switch is driven by the second input signal.

9. The low charge-injection charge pump according to claim 1, wherein the first FET switch is a PMOS switch, the first FET current source is a PMOS current source, the second FET switch is an NMOS switch, and the second FET current source is an NMOS current source.

10. A low charge-injection charge pump for controlling an input of a voltage controlled oscillator, comprising:
   a first FET having a gate biased by a first bias voltage, a source for receiving current, and a drain for supplying a first charge to a charge summing node,
   a second FET having a gate controlled by a first control signal, a drain for supplying current to the source of the first FET, and a source coupled to a first voltage source,
   a third FET having a gate controlled by the first control signal, a drain coupled to the drain of the second FET, and a source coupled to a second bias voltage having a value substantially equal to a value of the first bias voltage, wherein the second FET is turned ON when the first control signal is asserted so that a difference in voltage between the source and gate of the first FET turns the first FET ON thereby allowing a first charge to flow from the drain of the first FET into the charge summing node, and wherein the third FET is turned ON when the first control signal is deasserted so that a channel charge of the second FET flows through the third FET and so that the second bias voltage is supplied to the source of the first FET via the third FET so that a difference in voltage between the source and gate of the first FET turns the first FET OFF thereby preventing the first FET from supplying charge to the charge summing node, wherein said third FET is turned ON when said second FET is turned OFF to prevent residual charge from the second FET from being conducted through the first FET to the charge summing node;
   a fourth FET having a gate biased by a third bias voltage, a drain for receiving current from the charge summing node, and a source for supplying current,
   a fifth FET having a gate controlled by a second control signal, a drain for receiving current from the source of the fourth FET, and a source coupled to a second voltage source,
   a sixth FET having a gate controlled by the second control signal, a drain coupled to the drain of the fourth FET, and a source coupled to a fourth bias voltage having a value substantially equal to a value of the third bias voltage, wherein the fourth FET is turned ON when the second control signal is asserted so that a difference in voltage between the source and gate of the fourth FET turns the fourth PET ON, thereby allowing a second charge to flow from the charge summing node into the drain of the fourth FET, and wherein the sixth FET is turned ON when the second control signal is deasserted so that a channel charge of the fifth FET flows through the sixth FET and so that the fourth bias voltage is supplied to the source of the fourth FET via the sixth FET so that a difference in voltage between the source and gate of the fourth FET turns the fourth FET OFF thereby preventing the fourth FET from supplying charge into the charge summing node, wherein said sixth FET is turned ON when said fourth FET is turned OFF to prevent residual charge from the fourth FET from being conducted through the fourth FET to the charge summing node, and wherein a sum of the first and second charge on the charge summing node results in the output voltage that controls the input of the voltage controlled oscillator.

11. A low charge-injection charge pump for supplying charge into a charge summing node to generate a low noise output voltage, comprising:
   a first FET having a gate biased by a first bias voltage, a source for receiving current, and a drain for supplying a first charge to the charge summing node,
   a second FET having a gate controlled by a first control signal, a drain for supplying current to the source of the first FET, and a source coupled to a first supply voltage,
   a third FET having a gate controlled by the first control signal, a drain coupled to the drain of the second FET, and a source coupled to a second bias voltage having a value substantially equal to a value of the first bias voltage, wherein the second FET is turned ON only when the first control signal is asserted so that a difference in voltage between the source and gate of the first FET turns the first FET ON thereby allowing a first charge to flow from the drain of the first FET into the charge summing node, and wherein the third FET is turned ON only when the first control signal is deasserted so that a channel charge of the second FET flows through the third FET while the second bias voltage is supplied to the source of the first FET via the third FET so that a difference in voltage between the source and gate of the first FET turns the first FET OFF thereby preventing the first FET from supplying charge to the charge summing node, wherein the charge on the charge summing node results in the output voltage.

12. A low charge-injection charge pump for supplying charge to a charge summing node to generate a low noise output voltage, comprising
   a first current source, coupled to a charge summing node, for supplying the charge to the charge summing node, the first current source being biased by a first bias voltage, a first FET switch coupled to the first current source, the first switch being turned ON when a control signal is asserted and being turned OFF when the control signal is deasserted, the first FET switch supplying current to the first current source only when the first FET switch is turned ON, and the first bias voltage being set so that the first current source is turned ON when the first switch is turned ON, a second FET switch coupled to the first FET switch, the second FET switch being turned ON in response to deassertion of the control signal and being turned OFF in response to assertion of the control signal, the second FET switch removing channel charge from the first FET switch and coupling a second bias voltage approximately equal to the first bias voltage to the first current source when the second FET switch is turned ON and the first FET switch is turned OFF.

13. A method for supplying charge to a charge summing node to generate a low noise output voltage by a circuit, the circuit comprising a first FET current source coupled to the charge summing node and a first FET switch for supplying current to the first FET current source, the method comprising the steps of:

controlling the first FET switch to turn ON so that current is supplied to the first FET current source, thereby causing the first FET current source to supply charge to the charge summing node, and biasing the first FET current source to cause the first FET current source to turn ON when the first FET switch is turned ON; then controlling the first FET switch to turn OFF so that current is not supplied to the first FET current source, thereby preventing the first FET current source from supplying charge to the charge summing node, and biasing the first FET current source to cause the first FET current source to turn OFF when the first FET switch is turned OFF.

14. The method for supplying charge to a charge summing node according to claim 13, further comprising the steps of:

coupling a first low impedance path to the first FET switch when the first FET switch is turned OFF so that channel charge present in the channel of the first FET switch is removed;

decoupling the first low impedance path from the first FET switch when the first FET switch is turned ON, thereby preventing channel charge present in the first FET switch from causing noise in the output voltage of the charge summing node.

15. The method for supplying charge to a charge summing node according to claim 13, wherein the circuit further comprises a second FET current source coupled to the charge summing node and a second FET switch for removing current from the second FET current source, the method further comprising the steps of:

controlling the second FET switch to turn ON so that current is removed from the second FET current source, thereby causing the second FET current source to remove charge from the charge summing node and biasing the second FET current source to cause the second FET current source to turn ON when the second FET switch is turned ON; then controlling the second FET switch to turn OFF so that current is not removed from the second FET current source, thereby preventing the second FET current source from removing charge from the charge summing node, and biasing the second FET current source to cause the second FET current source to turn OFF when the second FET switch is turned OFF.

16. The method-for supplying charge to a charge summing node according to claim 15, further comprising the steps of:

coupling a second low impedance path to the second FET switch when the second FET switch is turned OFF so that channel charge present in the channel of the second FET switch is removed; and decoupling the second low impedance path from the second FET switch when the second FET switch is turned ON; thereby preventing channel charge present in the second FET switch from causing noise in the output voltage of the charge summing node.

* * * * *